United States Patent
Ryo et al.

(10) Patent No.: US 10,086,474 B2
(45) Date of Patent: Oct. 2, 2018

(54) PROTECTIVE FILM APPLYING APPARATUS AND PROTECTIVE FILM APPLYING METHOD

(71) Applicant: DISCO CORPORATION, Tokyo (JP)

(72) Inventors: Senichi Ryo, Tokyo (JP); Kenta Nakano, Tokyo (JP); Yukinobu Ohura, Tokyo (JP); Toshiyuki Yoshikawa, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/623,933

(22) Filed: Jun. 15, 2017

(65) Prior Publication Data

US 2017/0368636 A1  Dec. 28, 2017

(30) Foreign Application Priority Data

Jun. 24, 2016 (JP) .................................. 2016-125503

(51) Int. Cl.

| H01L 21/02 | (2006.01) |
|---|---|
| B23K 26/18 | (2006.01) |
| H01L 21/78 | (2006.01) |
| H01L 21/66 | (2006.01) |
| B23K 26/364 | (2014.01) |
| B05B 3/02 | (2006.01) |
| B05D 1/00 | (2006.01) |
| B23K 101/40 | (2006.01) |

(52) U.S. Cl.
CPC .............. B23K 26/18 (2013.01); B05B 3/02 (2013.01); B05D 1/005 (2013.01); B23K 26/364 (2015.10); H01L 21/02041 (2013.01); *H01L 21/02334* (2013.01); *H01L 21/78* (2013.01); *H01L 22/12* (2013.01); *H01L 22/20* (2013.01); *B23K 2201/40* (2013.01)

(58) Field of Classification Search
CPC ......... H01L 21/02079; H01L 21/02082; H01L 21/02225; H01L 21/02227; H01L 21/0226; H01L 21/02296; H01L 21/02334
See application file for complete search history.

(56) References Cited

U.S. PATENT DOCUMENTS

2009/0163037 A1* 6/2009 Miya ....................... C23C 16/40
438/778

FOREIGN PATENT DOCUMENTS

JP      2006-140311      6/2006

* cited by examiner

*Primary Examiner* — Cheung Lee

(57) ABSTRACT

A protective film applying apparatus includes a protective film forming and cleaning unit for forming a protective film on a surface of a wafer and cleaning the protective film away. A coverage state detector detects a coverage state of the protective film, and a controller determines whether or not the protective film has a film thickness falling within a predetermined range. If the controller decides that the thickness of the protective film does not fall in the predetermined range, the controller operates the protective film forming and cleaning unit to clean away the protective film, performs a pretreating process selected depending on the film thickness on the surface, and operates the protective film forming and cleaning unit to form a protective film again on the surface of the wafer.

1 Claim, 8 Drawing Sheets

PROTECTIVE FILM APPLYING APPARATUS AND PROTECTIVE FILM APPLYING METHOD

BACKGROUND OF THE INVENTION

Field of the Invention

The present invention relates to a protective film applying apparatus and a protective film applying method for forming a protective film on the surface of a workpiece.

Description of the Related Art

Heretofore, according to the process of manufacturing semiconductor devices, the surface (processed surface) of a wafer (workpiece) is demarcated into a plurality of chip areas by a plurality of streets arranged in a grid pattern on the wafer, and devices including integrated circuits (ICs), large scale integration (LSI) circuits, etc. are formed in the chip areas. The wafer with the devices thus formed is divided into chips by a laser processing process in which a laser beam is applied to the wafer along the streets to divide the wafer. In the laser processing process, when the laser beam is applied to the wafer, minute dust particles referred to as debris are produced from the wafer and scattered and deposited on the surfaces of the devices. In order to deal with this problem, there has been proposed a technology wherein after a protective film has been formed on the surface of a wafer, a laser processing process is performed on the wafer, and then the protective film and debris deposited thereon are washed away (for details, see, for example, Japanese Patent Laid-Open No. 2006-140311).

SUMMARY OF THE INVENTION

However, some surface conditions of a wafer which include the shapes of devices formed on the surface of the wafer along streets thereon make it difficult to form a protective film appropriately on the surface of the wafer.

It is an object of the present invention to provide a protective film applying apparatus and a protective film applying method which are capable of forming a protective film appropriately on the processed surface of a workpiece irrespectively of the conditions of the processed surface of the workpiece.

In accordance with an aspect of the present invention, there is provided a protective film applying apparatus including protective film applying means for forming a protective film on a processed surface of a workpiece, cleaning means for cleaning away the protective film formed on the processed surface, detecting means for detecting a coverage state of the protective film which has been formed on the processed surface of the workpiece by the protective film applying means, and control means for controlling the protective film applying means, the cleaning means, and the detecting means. The control means determines whether or not the protective film formed on the processed surface has a film thickness falling within a predetermined range on the basis of a detected signal from the detecting means, and if the control means decides that the film thickness of the protective film does not fall in the predetermined range, the control means operates the cleaning means to clean away the protective film formed on the processed surface, performs a pretreating process selected depending on a magnitude of the film thickness with respect to the predetermined range, on the processed surface, and operates the protective film applying means to form a protective film again on the processed surface.

With the above arrangement, since an optimum pretreating process can be selected on the basis of the coverage state of the protective film on the workpiece, the protective film can appropriately be formed on the processed surface of the workpiece depending on the state of the processed surface. The film thickness refers to a value representing the coverage state of the protective film, which includes a coverage factor of the protective film with respect to the processed surface of the workpiece.

The pretreating process may include a process of irradiating the processed surface with an ultraviolet radiation or a process of supplying water to the processed surface. The protective film may be formed from a water-soluble liquid resin, and the cleaning means may use water as a cleaning liquid.

In accordance with another aspect of the present invention, there is provided a method of applying a protective film including a resin to a surface of a workpiece. The method includes the steps of holding a reverse side of the workpiece while exposing the surface of the workpiece, forming a protective film on the exposed surface of the workpiece, and determining whether or not the protective film covers the surface in a predetermined range. If it is decided that a film thickness of the protective film formed on the surface of the workpiece does not fall in the predetermined range, then the formed protective film is cleaned away, a pretreating process selected depending on a magnitude of the film thickness with respect to the predetermined range is performed on the surface of the workpiece, and a protective film is formed again on the surface.

According to the present invention, since an optimum pretreating process can be selected on the basis of the coverage state of the protective film on the workpiece, the protective film can appropriately be formed on the processed surface of the workpiece depending on the state of the processed surface.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described in detail below with reference to the accompanying drawings. However, the present invention should not be interpreted as being limited to the illustrated embodiments. Various components according to the embodiments described below should be construed as covering those which could easily be imagined by person skilled in the art and also those which are essentially identical. Further, the configurations described below may be suitably combined and may be omitted, replaced, or modified without departing from the scope and spirit of the present invention.

Figure 1:
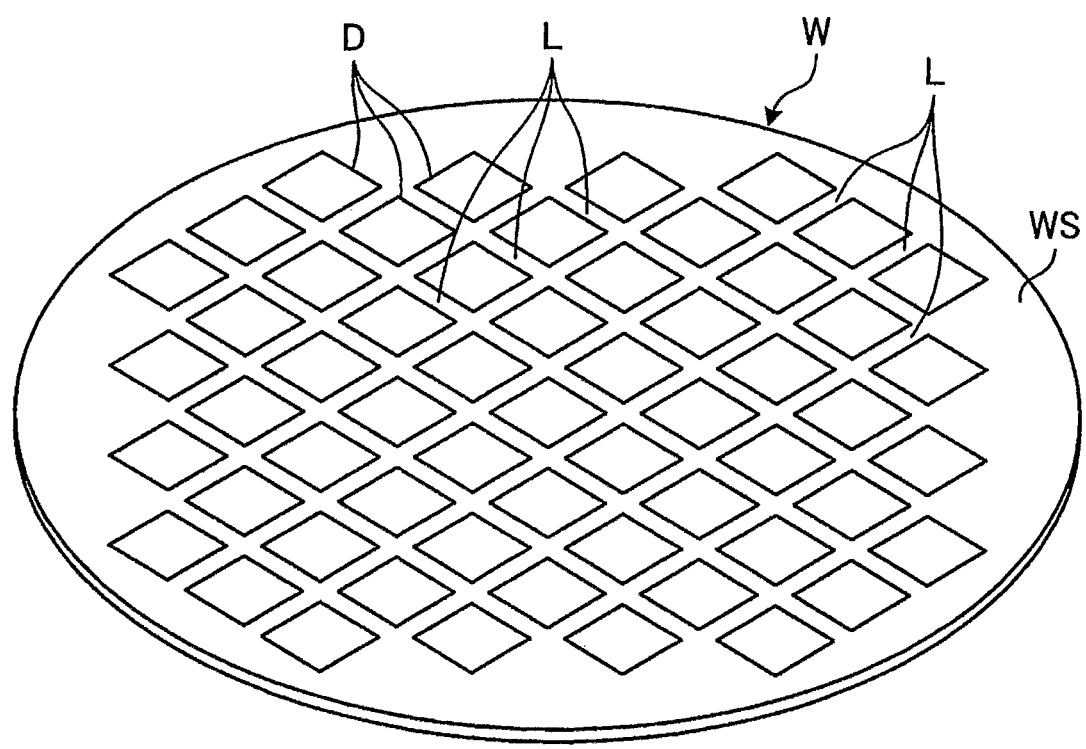
FIG. 1 is a perspective view of a wafer (workpiece) to be processed by a laser processing apparatus according to an embodiment of the present invention.

FIG. 1 depicts in perspective a wafer (workpiece) to be processed by a laser processing apparatus according to an embodiment of the present invention. As depicted in FIG. 1, a wafer W is a semiconductor wafer or optical device wafer having a disk-shaped substrate WS. The substrate WS of the wafer W is made of silicon, sapphire, gallium, or the like, for example. The wafer W has a plurality of streets (projected dicing lines) L formed in a grid pattern on one surface (processed surface) of the substrate WS (wafer W), and a plurality of devices D formed in respective areas that are demarcated by the streets L.

Figure 2:
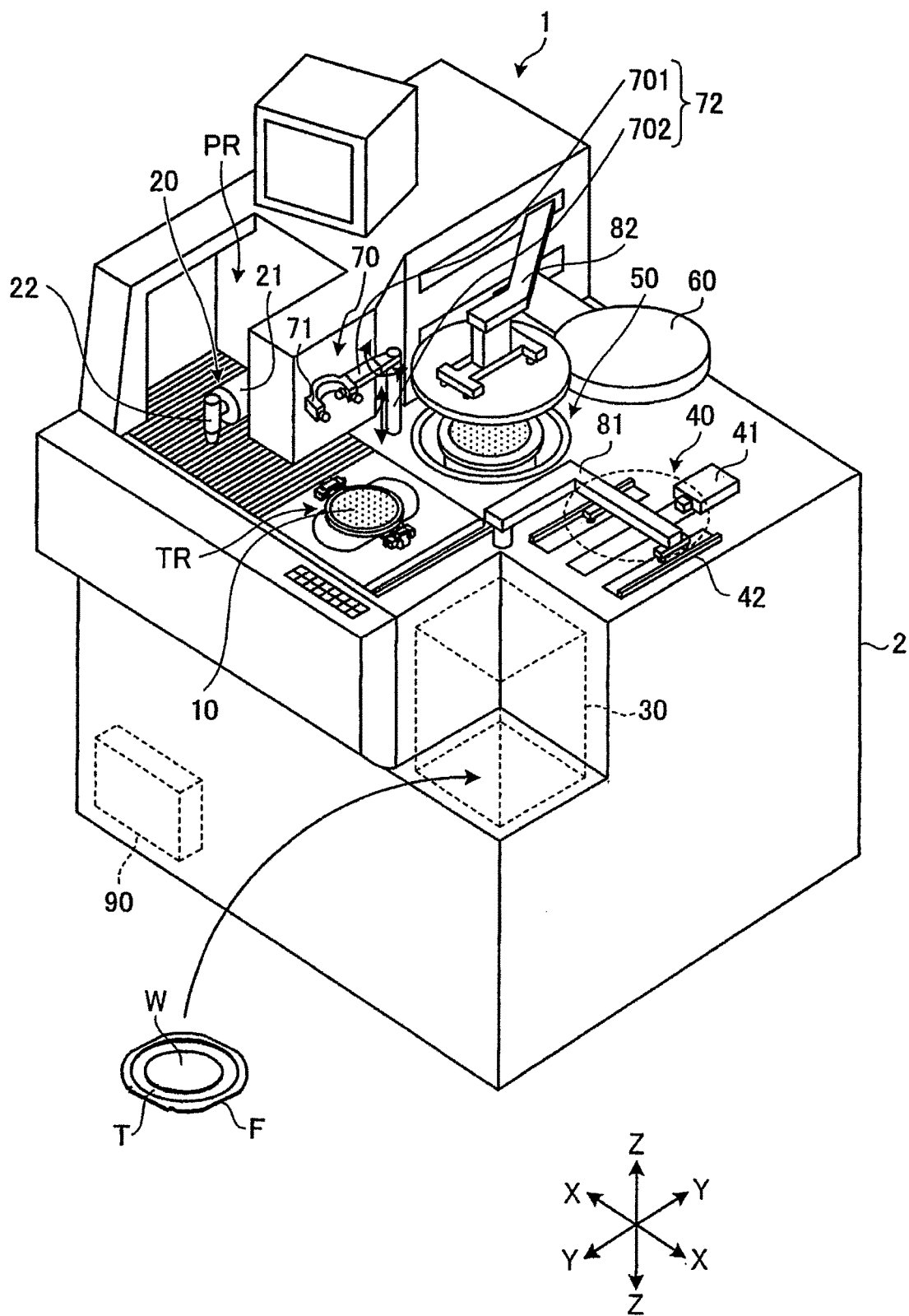
FIG. 2 is a perspective view of the laser processing apparatus according to the present embodiment.

FIG. 2 depicts in perspective the laser processing apparatus according to the present embodiment. A laser processing apparatus, which serves as a protective film applying apparatus, generally denoted by 1, operates to form a water-soluble protective film on the surface (processed surface) of the wafer W and also to form laser-processed grooves in the wafer W by applying a laser beam to the wafer W along the streets L thereon. The process for forming the laser-processed grooves will be referred to as "laser processing process." After the laser processing process has been carried out, the protective film is removed from the surface of the wafer W.

As depicted in FIG. 2, the laser processing apparatus 1 includes a chuck table 10 and a laser beam irradiator 20. The laser processing apparatus 1 also includes a cassette elevator, not depicted, for placing thereon a cassette 30 that stores therein wafers W to be laser-processed, and a temporary rest 40 for temporarily placing thereon a wafer W that is to be laser-processed or that has been laser-processed. The laser processing apparatus 1 further has a protective film forming and cleaning unit 50 for forming a protective film on a wafer W that is to be laser-processed and removing a protective film from a wafer W that has been laser-processed. The laser processing apparatus 1 further includes an ultraviolet irradiator 60 for applying an ultraviolet radiation to a wafer W that is to be laser-processed and a coverage state detector (detecting means) 70 for detecting the coverage state of a protective film formed on the surface of the wafer W. The laser processing apparatus 1 also has X-axis moving means, not depicted, for relatively moving the chuck table 10 and the laser beam irradiator 20 in X-axis directions, Y-axis moving means, not depicted, for relatively moving the chuck table 10 and the laser beam irradiator 20 in Y-axis directions, and Z-axis moving means, not depicted, for relatively moving the chuck table 10 and the laser beam irradiator 20 in Z-axis directions. Furthermore, the laser processing apparatus 1 includes a controller (control means) 90 disposed in an apparatus body 2 for controlling operation of various parts of the laser processing apparatus 1.

The chuck table 10 holds thereon a wafer W with a protective film formed thereon at the time the wafer W is laser-processed. The chuck table 10 is in the form of a disk having a portion that provides a surface thereof and that is made of a porous ceramics or the like. The chuck table 10 is connected to a vacuum suction source, not depicted, through a vacuum suction passageway, not depicted. The chuck table 10 holds the wafer W under suction on its surface by attracting the reverse side of the wafer W placed on the surface of the chuck table 10 with suction forces from the vacuum suction source. The chuck table 10 is movable in the X-axis directions by the X-axis moving means between a loading/unloading region TR near the cassette 30 on the cassette elevator and a processing region PR near the laser beam irradiator 20, and is also movable in the Y-axis directions by the Y-axis moving means.

The laser beam irradiator 20 functions as processing means and is provided in the processing region PR on the apparatus body 2. The laser beam irradiator 20 irradiates the surface of the wafer W held on the chuck table 10 with a laser beam to form a laser-processed groove in the wafer W. The laser beam has a wavelength absorbable by the wafer W. The laser beam irradiator 20 is movable by the Z-axis moving means in the Z-axis directions with respect to the wafer W held on the chuck table 10. The laser beam irradiator 20 has an oscillator 21 for oscillating a laser beam and a beam condenser 22 for converging the laser beam oscillated by the oscillator 21. The oscillator 21 adjusts the frequency of a laser beam to be oscillated, depending on the type of the wafer W and the manner in which the wafer W is to be processed. The oscillator 21 may include an yttrium aluminum garnet (YAG) laser oscillator or an yttrium orthovanadate (YVO4) laser oscillator, for example. The beam condenser 22 includes a total reflection mirror for changing the direction of travel of the laser beam oscillated by the oscillator 21 and a condensing lens for converging the laser beam.

The cassette 30 stores therein a plurality of wafers W each bonded to an annular frame F by an adhesive tape T. The cassette elevator is mounted in the apparatus body 2 of the laser processing apparatus 1 so as to be vertically movable in the Z-axis directions.

The temporary rest 40 removes a wafer W that is to be laser-processed, one at a time, from the cassette 30 and stores a wafer W that has been laser-processed into the cassette 30. The temporary rest 40 includes loading/unloading means 41 for removing a wafer W that is to be laser-processed from the cassette 30 and inserting a wafer W that has been laser-processed into the cassette 30, and a pair of rails 42 for temporarily placing thereon a wafer W that is to be laser-processed or that has been laser-processed.

The protective film forming and cleaning unit 50 is loaded with a wafer W that is to be laser-processed from the pair of rails 42 by first feed means 81, and forms a protective film on the loaded wafer W that is to be laser-processed. The protective film forming and cleaning unit 50 is also loaded with a wafer W that has been laser-processed by second feed means 82, and removes a protective film from the loaded wafer W that has been laser-processed. The protective film forming and cleaning unit 50 thus functions as both protective film applying means for forming (applying) a protective film on the surface of a wafer W and cleaning means for cleaning a protective film away from the surface of a wafer W. Each of the first and second feed means 81 and 82 is constructed to attract and lift the surface of a wafer W and to lift and feed the wafer W to a desired position.

Figure 3:
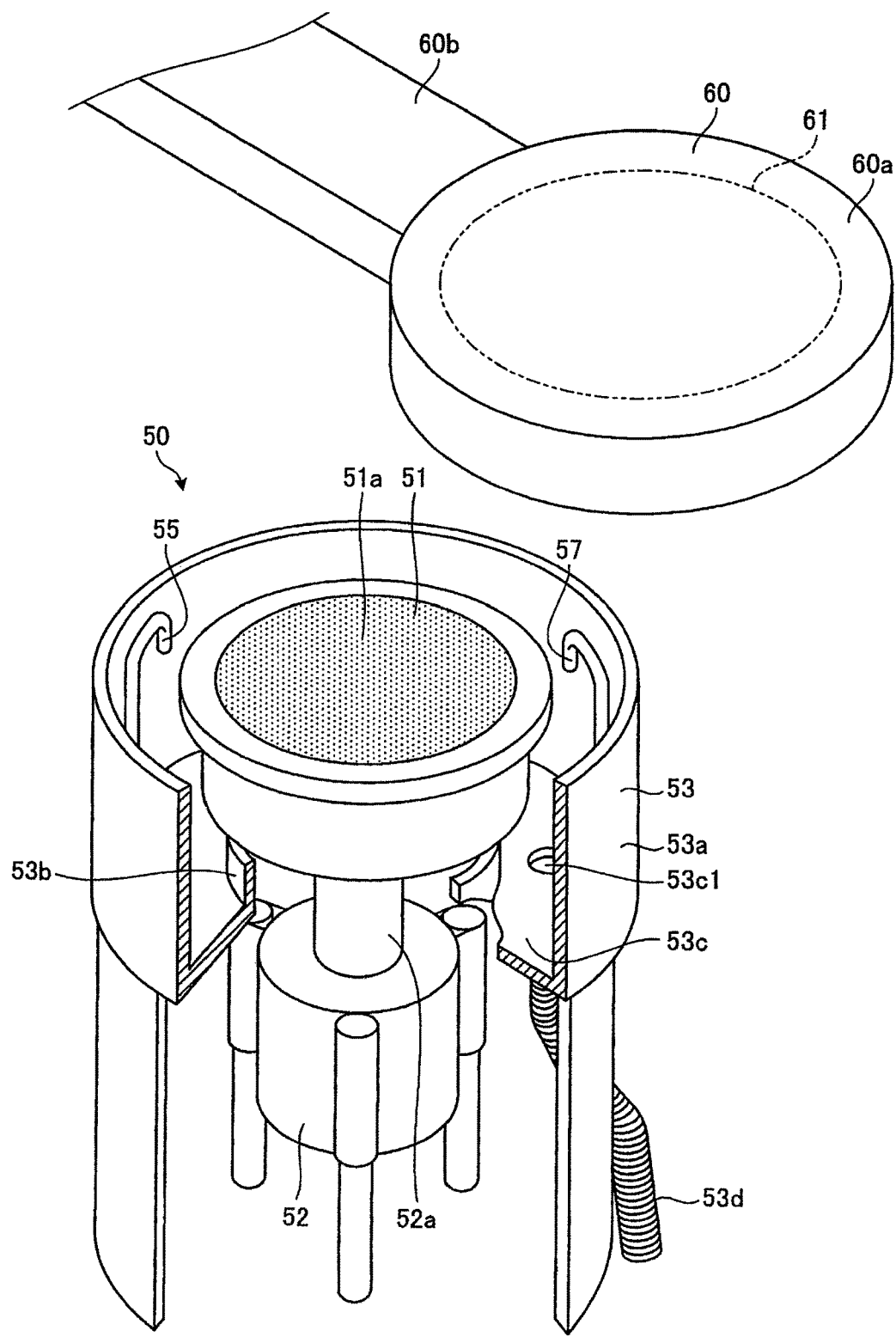
FIG. 3 is a perspective view of a protective film forming and cleaning unit and an ultraviolet irradiator of the laser processing apparatus.

FIG. 3 depicts in perspective the protective film forming and cleaning unit and the ultraviolet irradiator. As depicted in FIG. 3, the protective film forming and cleaning unit 50 includes a spinner table 51 for holding a wafer W that is to be laser-processed or that has been laser-processed, an electric motor 52 for rotating the spinner table 51 about an axis parallel to the Z-axis directions (see FIG. 2), and a liquid receptacle 53 disposed around the spinner table 51. The spinner table 51 has an attraction chuck 51a in the form of a disk that is disposed centrally in the upper surface thereof and that is made of a porous ceramics or the like. The attraction chuck 51a is held in fluid communication with suction means, not depicted. The spinner table 51 holds a wafer W under suction on the attraction chuck 51a with suction forces from the suction means.

The electric motor 52 has a drive shaft 52a with the spinner table 51 coupled to its upper end, so that the spinner table 51 is rotatably supported on the electric motor 52. The rotational speed of the electric motor 52 is controlled by the controller 90. The liquid receptacle 53, which is of an annular shape, includes a hollow cylindrical outer side wall 53a and a hollow cylindrical inner side wall 53b which are radially spaced from each other and a bottom wall 53c interconnecting the outer side wall 53a and the inner side wall 53b. The liquid receptacle 53 receives an excess of a liquid resin supplied to the surface of the wafer W for forming a protective film thereon and an excess of cleaning water (cleaning liquid) supplied to the surface of the wafer W for cleaning and removing the protective film therefrom. The bottom wall 53c has a liquid drain port 53d to which a drain hose 53d is connected.

The protective film forming and cleaning unit 50 has a resin liquid supply nozzle 55 for supplying a water-soluble liquid resin to form a protective film on the wafer W held on the spinner table 51, and a cleaning water nozzle 57 for supplying cleaning water to the wafer W that has been laser-processed on the spinner table 51. Each of the nozzles 55 and 57 is movable selectively to an operative position where the nozzle opening is positioned above the center of the spinner table 51 and a retracted position where the nozzle opening is displaced off the spinner table 51. The resin liquid supply nozzle 55 is connected to a liquid resin supply source, not depicted, so as to be able to supply a water-soluble liquid resin to the surface of the wafer W. The liquid resin supply source includes a temperature regulator for regulating the temperature of the supplied liquid resin, thereby adjusting the viscosity of the liquid resin.

The liquid resin may be of a water-soluble resin material such as PVA (polyvinyl alcohol), PEG (polyethylene glycol), PVP (polyvinyl pyrrolidone), polyethylene oxide, polyethyleneimine, carboxymethyl cellulose, hydroxyethyl cellulose, or the like. The viscosity of these liquid resins that can be used is in the range from 20 to 400 (cp). The liquid resin contains an absorbent for assisting in absorbing the laser beam. The absorbent may be, for example, 4,4'-dicarboxy benzophenone, benzophenone-4-carboxylic acid, 2-carboxy anthraquinone, 1,2-naphthalene dicarboxylic acid, 1,8-naphthalene dicarboxylic acid, 2,3-naphthalene dicarboxylic acid, 2,6-naphthalene dicarboxylic acid, 2,7-naphthalene dicarboxylic acid, or any of sodium salts, potassium salts, ammonium salts, quaternary ammonium salts thereof, or the like, 2,6-anthraquinone disulfonic acid soda, 2,7-anthraquinone disulfonic acid soda, ferulic acid, or the like, dissolved into the liquid resin. Of these materials, ferulic acid is preferable for a laser beam wavelength of 355 nm used as a processing wavelength.

Instead of or in addition to organic compounds such as ferulic acid, 0.1 to 10 volume % of fine particles of an oxide for promoting processing in the ultraviolet wavelength range may be added to and dispersed in the liquid resin. The fine particles of the oxide may be, for example, $TiO_2$, ZnO, $Fe_2O_3$, $CeO_2$, CuO, $Cu_2O$, MgO, $SiO_2$, or the like.

When dried, any of these liquid resins used is solidified into a protective film on the surface of the wafer W for protecting the surface of the wafer W. The cleaning water nozzle 57 is connected to a cleaning water (e.g., pure water) supply source, not depicted, and supplies cleaning water to the surface of the wafer W on which the protective film has been formed, thereby removing the protective film. Before the liquid resin is supplied, the cleaning water nozzle 57 also functions as a pure water supply (pretreating means) for supplying pure water to the surface of the wafer W to perform a pretreating process for wetting the surface of the wafer W, thereby optimizing the coverage state of the protective film.

As depicted in FIG. 3, the ultraviolet irradiator 60 is disposed in facing relation to the spinner table 51 of the protective film forming and cleaning unit 50, and irradiates the wafer W on the spinner table 51 with an ultraviolet radiation. The ultraviolet irradiator 60 includes an irradiator body 60a and a support 60b that supports the irradiator body 60a. The support 60b supports the irradiator body 60a in a manner to make it movable selectively to an operative position where the irradiator body 60a is supported above the spinner table 51 arid a retracted position where the irradiator body 60a is displaced off the spinner table 51, in a range out of interference with the second feed means 82.

The irradiator body 60a is in the form of a circular plate including an annular peripheral wall extending downwardly from the peripheral edge of the circular plate, for example. The irradiator body 60a houses an ultraviolet lamp 61 therein. The irradiator body 60a is of a diameter which is essentially the same as the outside diameter of the liquid receptacle 53, and the ultraviolet lamp 61 housed therein is disposed to have its irradiation area covering the entire spinner table 51. The ultraviolet lamp 61 may be replaced with an ultraviolet light-emitting diode.

The ultraviolet lamp 61 selectively emits ultraviolet radiations having two different wavelengths of 185 nm and 254 nm, for example. The ultraviolet lamp 61 is disposed in facing relation to the surface of the wafer W on the spinner table 51, and performs a process of increasing the hydrophilicity of the surface of the wafer W. When the wafer W is irradiated with the ultraviolet radiation having the wavelength of 185 nm, oxygen molecules around the wafer W are decomposed to generate ozone ($O_3$). When the wafer W is then irradiated with the ultraviolet radiation having the wavelength of 254 nm, the generated ozone is decomposed to generate high-energy active oxygen. The generated active oxygen acts on the surface of the wafer W to increase the hydrophilicity of the surface of the wafer W. The coverage state of a protective film formed on the surface of the wafer W is thus optimized. Therefore, the ultraviolet lamp 61 functions as pretreating means for pretreating the surface of the wafer W to increase the hydrophilicity thereof, optimizing the coverage state of a protective film, before the liquid resin is supplied to the surface of the wafer W.

Figure 4:
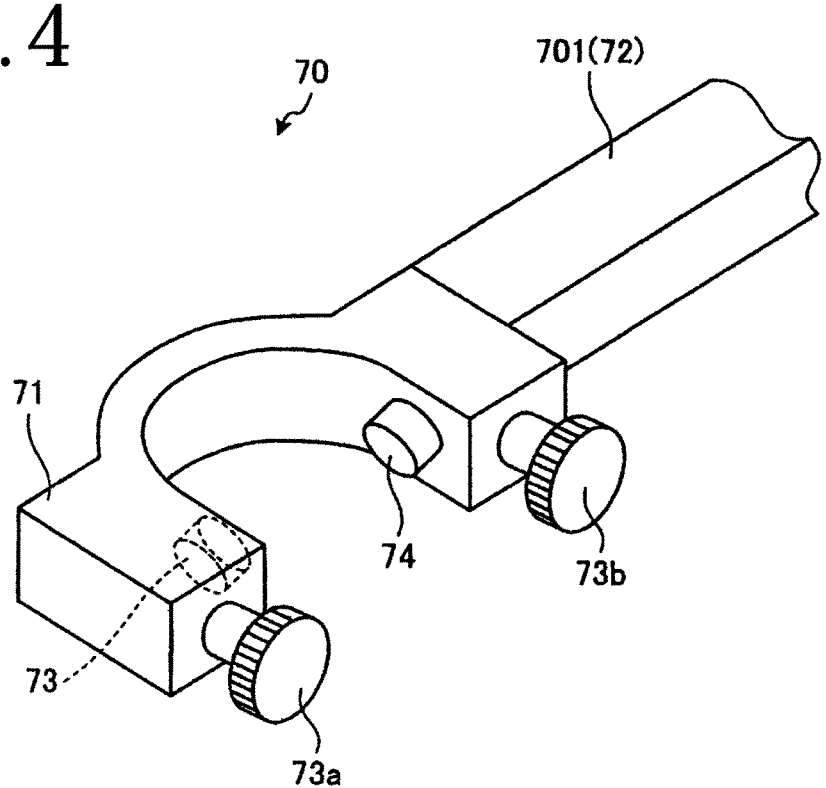
FIG. 4 is a perspective view of a coverage state detector of the laser processing apparatus.

The coverage state detector 70 measures the film thickness (a value representative of the coverage state) of a protective film formed on the surface of the wafer W. FIG. 4 depicts the coverage state detector in perspective, and FIG.

5 depicts in fragmentary perspective the manner in which the coverage state detector measures the thickness of a protective film. The coverage state detector 70 has a U-shaped frame 71 supported on a support 72 (see also FIG. 2) mounted on the apparatus body 2. As depicted in FIG. 2, the support 72 includes a vertical support rod 702 which is vertically movable and angularly movable about its own axis and a horizontal support arm 701 having an end fixed to the upper end of the vertical support rod 702. The frame 71 is attached to the other end of the horizontal support arm 701. The support 72 is provided between the spinner table 51 of the protective film forming and cleaning unit 50 and the chuck table 10. The support 72 moves the frame 71 selectively to a measurement position above the spinner table 51 and a standby position (see FIG. 2) retracted from the measurement position.

Figure 5:
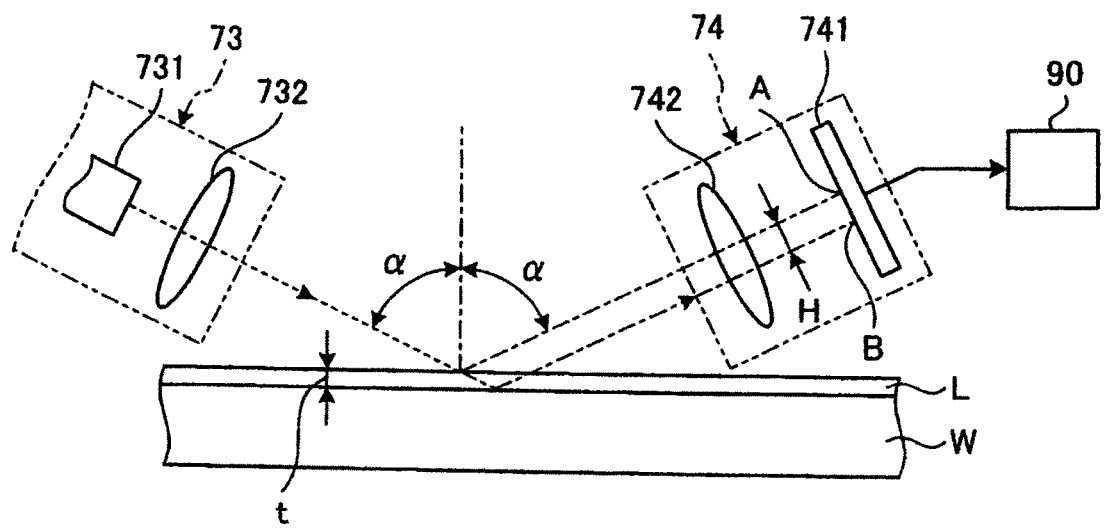
FIG. 5 is a fragmentary perspective view depicting the manner in which the coverage state detector measures a thickness of a protective film.

As depicted in FIGS. 4 and 5, the frame 71 supports a light emitter 73 and a light detector 74 disposed in facing relation to each other. As depicted in FIG. 5, the light emitter 73 includes a light-emitting element 731 and a light-transmitting lens 732. The light-emitting element 731 emits a laser beam having a wavelength of 670 nm, for example. As depicted in FIG. 5, the laser beam emitted from the light-emitting element 731 travels through the light-transmitting lens 732, and is applied to the wafer W held on the spinner table 51 at a predetermined incident angle $\alpha$.

As depicted in FIG. 5, the light detector 74 includes a light position detecting element 741 and a light-receiving lens 742. The light detector 74 is positioned such that it detects the laser beam emitted from the light emitter 73 after it has been regularly reflected by the wafer W. The light detector 74 sends a detected signal indicating that the light position detecting element 741 has detected the laser beam from the light emitter 73 to the controller 90. As depicted in FIG. 4, the coverage state detector 70 has angle adjustment knobs 73a and 73b for adjusting the respective angles of tilt of the light emitter 73 and the light detector 74. The angle adjustment knobs 73a and 73b are turned to adjust the incident angle $\alpha$ of the laser beam emitted from the light emitter 73 and the angle at which the light detector 74 detects the laser beam reflected by the wafer W.

A laser beam emitted from the light-emitting element 731 through the light-transmitting lens 732 is applied to the upper surface of a protective film on the processed surface of the wafer W, reflected thereby as indicated by the dot-and-dash line, and detected through the light-receiving lens 742 by the light position detecting element 741 at a point A thereon. On the other hand, a laser beam emitted from the light-emitting element 731 through the light-transmitting lens 732 also travels through the protective film, is reflected by the lower surface of the protective film as indicated by the two-dot-and-dash line, and detected through the light-receiving lens 742 by the light position detecting element 741 at a point B thereon. Light intensity data thus detected by the light position detecting element 741 are sent to the controller 90. The controller 90 then calculates a film thickness t of the protective film on the basis of a distance H ($t=H/2\sin\alpha$) between the point A and the point B that are detected by the light position detecting element 741. If the refractive index of the protective film is taken into consideration, then a coefficient corresponding to the refractive index should be introduced into the above equation. In the present description, the film thickness is a value representing the coverage state of the protective film. The controller 90 causes the coverage state detector 70 to measure film thicknesses at a plurality of measurement positions (observation points) on the protective film on the wafer W, and stores these measurement positions and the film thicknesses at the respective measurement positions in association with each other. The controller 90 then calculates a coverage factor of the protective film from the information representing the measurement positions and the film thicknesses that have thus been associated with each other.

According to the present embodiment, the coverage state detector 70 for measuring the film thickness of the protective film formed on the surface of the wafer W is configured to apply laser beams to the protective film on the wafer W and calculate (measure) the film thickness t of the protective film on the basis of the distance H between the point A and the point B that are detected by the light position detecting element 741. However, the coverage state detector 70 may be configured otherwise.

According to another configuration, not depicted, a coverage state detector has a light emitter for applying stimulating light (e.g., ultraviolet radiation) having a wavelength (e.g., 365 nm) different from a processing wavelength (e.g., 355 nm) to the protective film formed on the surface of the wafer W, and a light detector for detecting fluorescent light (having a wavelength in the range from 420 to 430 nm) emitted from the protective film in response to absorption thereby of the stimulating light. The absorbent contained in the protective film for assisting in absorbing the laser beam emits fluorescent light when the protective film is irradiated with the stimulating light. The controller 90 detects a fluorescent light intensity (a peak intensity or integrated intensity value between the wavelengths of 420 to 430 nm), and binarizes the detected fluorescent light intensity. The controller 90 then measures the film thickness t of the protective film by referring to a map that represents changes in an optical spectrum (spectral distribution) with respect to changes in the film thickness t of the protective film.

According to still another configuration, not depicted, a coverage state detector has a light emitter for applying a laser beam having a processing wavelength (e.g., 355 nm) to the protective film formed on the surface of the wafer W, and a light detector for detecting a laser beam reflected from the protective film on the basis of the laser beam applied thereto. The light detector converts the reflection intensity of the reflected beam into a voltage signal and outputs the voltage signal to the controller 90. The controller 90 then measures the film thickness t of the protective film by referring to a map that represents changes in the voltage signal with respect to changes in the film thickness t of the protective film.

With the coverage state detectors according to these other configurations, the controller 90 causes the coverage state detector to measure film thicknesses at a plurality of measurement positions preset on the protective film on the wafer W, stores these measurement positions and the film thicknesses at the respective measurement positions in association with each other, and calculates a coverage factor of the protective film from the information representing the measurement positions and the film thicknesses that have thus been associated with each other.

Figure 6:
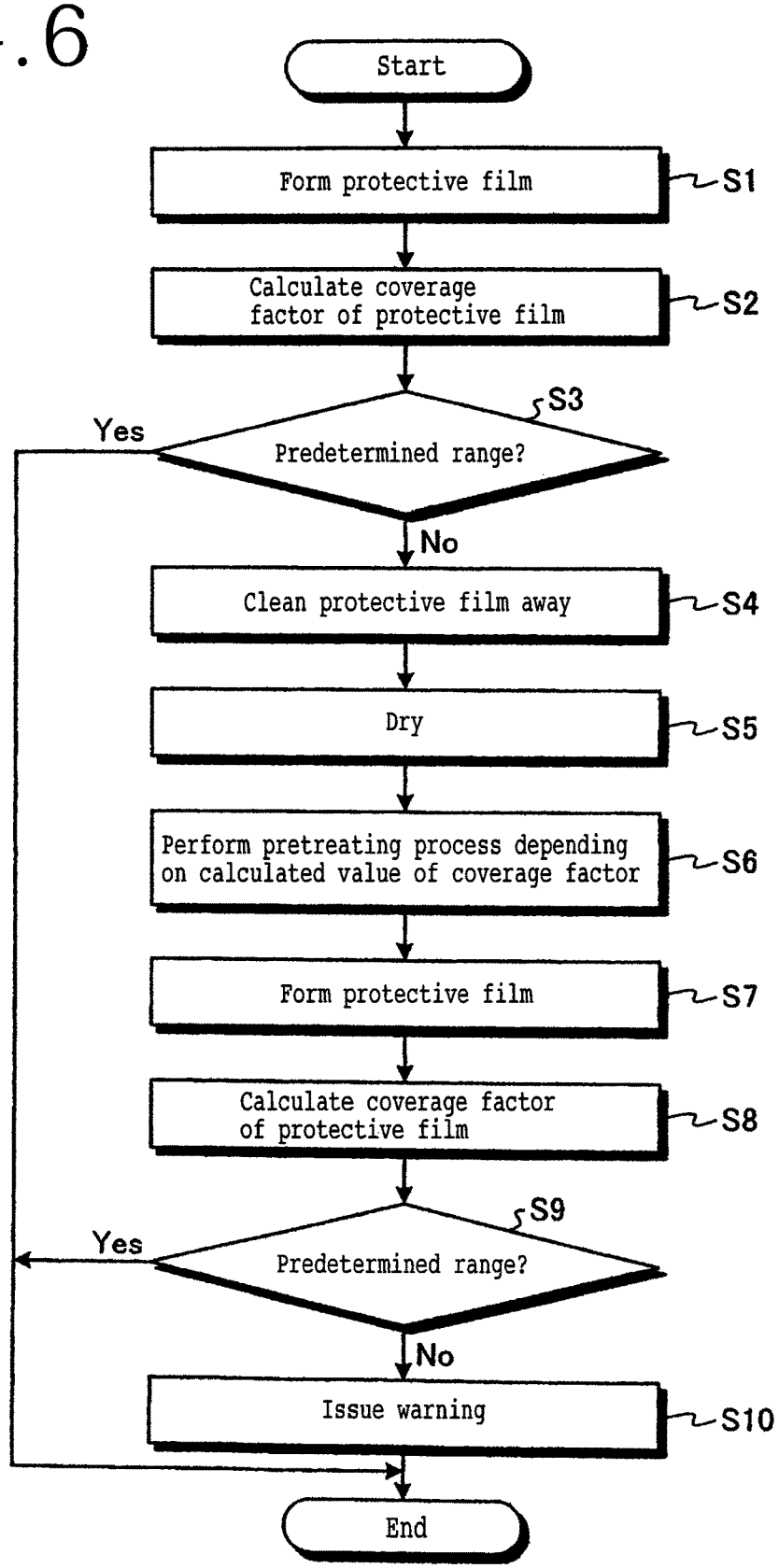
FIG. 6 is a flowchart of the sequence of a protective film applying method according to the embodiment.

A protective film applying method for applying a protective film to the surface of the wafer W will be described below. FIG. 6 is a flowchart of the sequence of a protective film applying method according to the present embodiment. The sequence is controlled by the controller 90. First, the reverse side of the wafer W to be processed is held on the spinner table 51. Specifically, a wafer W to be laser-processed is removed from the cassette 30 of the laser processing apparatus 1 by the loading/unloading means 41, and then placed on the pair of rails 42. The wafer W placed on the rails 42 is then fed to the spinner table 51 of the protective film forming and cleaning unit 50 by the first feed means 81. On the spinner table 51, the reverse side of the wafer W is held under suction on the attraction chuck 51a, and the surface of the wafer W is exposed upwardly.

Then, the liquid resin is supplied to the surface of the wafer W to form a protective film thereon (step S1). Specifically, the resin liquid supply nozzle 55 is positioned above the wafer W, and supplies a water-soluble liquid resin, e.g., PVA (polyvinyl alcohol), to the wafer W while the spinner table 51 is rotating at a predetermined rotational speed of 100 rpm, for example. At this time, the resin liquid supply nozzle 55 should preferably have its supply port positioned over the rotational axis of the spinner table 51. The supplied liquid resin spreads radially outwardly from the center of the wafer W under centrifugal forces produced by the rotation of the spinner table 51, so that the liquid resin on the wafer W can be adjusted to a uniform thickness in the range from 0.5 to 2 μm, for example. The liquid resin thus distributed over the wafer W is dried into a protective film on the surface of the wafer W. The film thickness of the protective film can be adjusted by the supplied amount of liquid resin, the rotational speed of the spinner table 51, the period of time during which the spinner table 51 rotates, or the method by which the liquid resin is dried into the protective film. For example, a protective film having a uniform film thickness can be formed from a small amount of liquid resin without coating irregularities by increasing and reducing the rotational speed of the spinner table 51 stepwise. The liquid resin may be dried into the protective film by rotating the wafer W with the spinner table 51 or applying light from a xenon flash lamp or the like to the liquid resin on the wafer W.

Then, a coverage factor of the protective film formed on the surface of the wafer W is calculated (step S2). Specifically, the frame 71 of the coverage state detector 70 is placed in the measurement position above the wafer W. The controller 90 energizes the light emitter 73 and the light detector 74, and measures the film thickness t of the protective film on the basis of the information of the light (detected signal) detected by the light detector 74 (t=H/2sinα). According to the present embodiment, the controller 90 measures film thicknesses t at a plurality of measurement positions on the protective film on the wafer W, and calculates a coverage factor R of the protective film from the information of the measurement positions and the film thicknesses t. The coverage factor R represents the ratio of the coverage area of the protective film to the processed surface (surface) of the wafer W. For example, the controller 90 calculates a coverage factor R of the protective film from the area of the protective film which is exclusive of an area of the wafer W where the film thickness is 0, i.e., an area of the wafer W which is not covered with a protective film. The film thicknesses t used to calculate the coverage factor may be measured using fluorescent light emitted from the protective film in response to absorption thereby of the stimulating light, or the reflection intensity of the reflected beam from the protective film. There is no need to calculate accurate film thicknesses in order to determine a coverage factor. Since fluorescent light or noise can be detected from a resin film of polyimide or the like formed beneath the protective film, a predetermined threshold value may be established for fluorescent intensities in detecting whether or not a protective film is formed. If a fluorescent light intensity in excess of the threshold value is detected, then it may be determined that a protective film is formed, and if a fluorescent light intensity smaller than the threshold value is detected, then it may be determined that a protective film is not formed.

Then, the controller 90 determines whether or not the coverage factor R of the protective film falls in a predetermined range (step S3). According to the present embodiment, the predetermined range refers to a range sufficient for the protective film to function as a protective film in the laser processing process.

If the coverage factor R of the protective film falls in the predetermined range (step S3: Yes), then the controller 90 decides that the protective film has properly been formed, and the sequence comes to an end. On the other hand, if the coverage factor R of the protective film does not fall in the predetermined range (step S3: No), then the controller 90 cleans the protective film away (step S4). Specifically, the controller 90 positions the cleaning water nozzle 57 above the wafer W and causes the cleaning water nozzle 57 to supply cleaning water to the wafer W. Since the protective film is formed of the dried water-soluble liquid resin, the cleaning water supplied to the protective film dissolves the protective film and removes it from the surface of the wafer W.

Then, the controller 90 dries the wafer W (step S5). Specifically, the controller 90 rotates the spinner table 51 at a rotational speed of 3000 rpm, for example, for approximately 15 seconds. At this time, it is preferable to apply dry air toward the rotating wafer W.

Then, the controller 90 selects and performs a pretreating process depending on the coverage factor R of the protective film that has been calculated in step S2 (step s6). Pretreating processes are preset depending on values of the coverage factor R of the protective film, as indicated in Table 1 below.

TABLE 1

| Coverage factor (%) | Pretreating processes to be selected |
|---|---|
| R ≥ α | — |
| α > R ≥ β | Changing rotational speed |
| β > R ≥ γ | Supplying pure water |
| γ > R ≥ 0 | Applying ultraviolet radiation |

According to the present embodiment, if the coverage factor R is lower than a predetermined threshold value (100%: hereinafter referred to as a threshold value Q for illustrative purposes), the controller 90 selects a pretreating process depending on the coverage factor R of the protective film. Specifically, the coverage factor R is equal to or larger than a first reference value α, i.e., if R≥α, the controller 90 performs no pretreating process, and control goes to step S7. The first reference value α is slightly smaller than the threshold value Q, and set to 95% of the threshold value Q. When a protective film is formed, its coverage factor R is expected to be lowered by minute defects or foreign matter in the protective film. The coverage factor R is often improved by forming a protective film again on the wafer W. If the coverage factor R is equal to or larger than the first reference value α, no pretreating process is performed, and control goes to step S7. Alternatively, control may go to step S7 after the protective film has been cleaned away (step S4) and the wafer has been dried (step S5).

If the coverage factor R is equal to or larger than a second reference value β, but smaller than the first reference value α, i.e., if α>R≥β, the rotational speed of the spinner table 51 for forming a protective film on the wafer W is changed in a pretreating process. The second reference value β is set to 90% of the threshold value Q. Since the rotational speed of the spinner table 51 affects the coverage factor R of the protective film, the coverage factor R of a protective film formed again can be increased by changing the rotational speed of the spinner table 51. The thickness of the protective film (liquid resin) supplied to the wafer W can also effectively be adjusted by increasing or reducing the rotational speed of the spinner table 51. If the coverage factor R is equal to or larger than a third reference value γ, but smaller than the second reference value β, i.e., if β>R≥γ, pure water is supplied to the surface of the wafer W in a pretreating process. The third reference value γ is set to 50% of the threshold value Q. Since the wettability of the surface of the wafer W increases by supplying the surface of the wafer W with pure water, the liquid resin is more likely to spread on the surface of the wafer W when a protective film is to be formed again, increasing the coverage factor R thereof. If the coverage factor R is smaller than the third reference value γ, i.e., if γ>R≥0, the surface of the wafer W is irradiated with an ultraviolet radiation in a pretreating process. Since the hydrophilicity of the surface of the wafer W increases by irradiating the surface of the wafer W with an ultraviolet radiation, the liquid resin is more likely to spread on the surface of the wafer W when a protective film is to be formed again, increasing the coverage factor R thereof. The first reference value α, the second reference value β, and the third reference value γ are established such that they are progressively smaller in the order named, and can be changed to appropriate values.

Then, the controller 90 supplies the surface of the wafer W with the liquid resin again to form a protective film thereon (step S7). Inasmuch as a pretreating process selected depending on the coverage factor R has been performed in step S6, the coverage factor R of the protective film formed in step S7 is higher than the coverage factor R of the protective film formed in step S1. Thereafter, the controller 90 calculates the coverage factor R of the protective film formed again on the surface of the wafer W (step S8). The coverage factor R is calculated on the basis of the film thicknesses t of the protective film in the same manner as with step S2 described above.

Then, the controller 90 determines whether or not the measured coverage factor R of the protective film falls in the predetermined range (step S9). In step S9, the controller 90 determines in the same manner with step S3. If the coverage factor R of the protective film falls in the predetermined range (step S9: Yes), then the controller 90 decides that the protective film has properly been formed on the wafer W because of the pretreating process selected and performed in step S6, and brings the sequence to an end. From now on, the controller 90 will form protective films on subsequent wafers W after performing the pretreating process selected in step S6 on the surfaces of the wafers W.

On the other hand, if the coverage factor R of the protective film does not fall in the predetermined range (step S9: No), then the controller 90 decides that the coverage factor R of the protective film is not appropriate despite the pretreating process selected and performed in step S6, and issues a warning (step S10). Based on the warning, the operator may change film forming conditions for forming protective films. The film forming conditions may include, for example, changing the rotational speed of the spinner table 51 and the period of time during which the spinner table 51 rotates, adjusting the amount and temperature of the liquid resin supplied to the wafer W, and adjusting the method by which the liquid resin is dried into the protective film and the period of time during which the liquid resin is dried into the protective film. The thickness of the protective film (liquid resin) supplied to the wafer W can also effectively be adjusted by increasing or reducing the rotational speed of the spinner table 51. For example, immediately after the liquid resin has been supplied to the wafer W, the controller 90 rotates the spinner table 51 at a high speed to spread the liquid resin over the wafer W, and then lowers the rotational speed of the spinner table 51 to make the liquid resin stable. The controller 90 rotates the spinner table 51 again at a high speed to adjust the protective film (liquid resin) to a desired uniform thickness.

The wafer W with the protective film formed thereon is delivered onto the chuck table 10, and processed by a laser beam that is applied from the beam condenser 22 of the laser beam irradiator 20 through the protective film on the wafer w to a given street L on the wafer W. When the wafer W is thus laser-processed, the given street L may be irradiated in a half cutting mode with a single laser beam to form a processed groove in the wafer W which does not reach the reverse side of the wafer W or in a full cutting mode with a plurality of laser beams to form a processed groove in the wafer W which substantially reaches the reverse side of the wafer W. Alternatively, after two film peel prevention grooves have been formed in the wafer W, a dividing groove may be formed to a predetermined depth in the film layer and the substrate centrally between the two film peel prevention grooves (see Japanese Patent Laid-open No. 2006-196641).

According to the present embodiment, as described above, the protective film applying method has the step of holding the reverse side of the wafer W while exposing the surface of the wafer W, the step of forming a protective film on the exposed surface of the wafer W, and the step of determining whether or not the protective film covers the surface of the wafer W in a predetermined range. If it is determined that the coverage factor R of the formed protective film does not fall in the predetermined range, the formed protective film is cleaned away, and then a pretreating process selected depending on the coverage factor R is performed on the surface of the wafer W, after which a protective film is formed again on the surface of the wafer W. Therefore, an optimum pretreating process can be selected depending on the coverage state of the protective film, so that a protective film can appropriately be formed depending on the state of the wafer W. According to the present embodiment, in particular, since the coverage factor R calculated from the film thickness of the protective film is used, the coverage state of the overall protective film formed on the surface of the wafer W can be easily and quickly detected.

Figure 7:
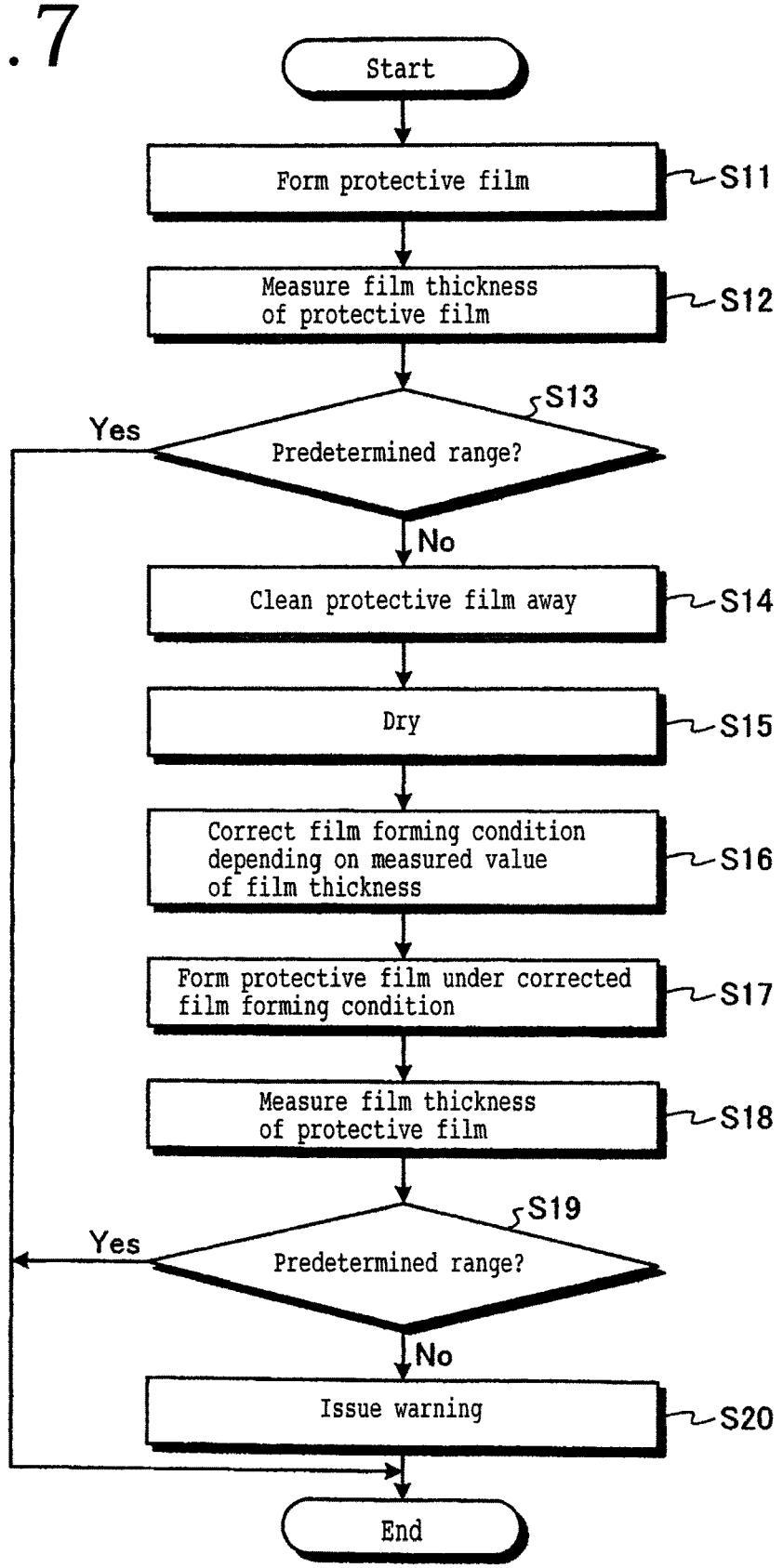
FIG. 7 is a flowchart of the sequence of a protective film applying method according to a modification.

A modification of the protective film applying method will be described below. According to the protective film applying method described above, the coverage factor R is used as a value representing the state of the protective film, and it is detected whether or not the protective film covers the wafer W. According to the modification, a process depending on the film thickness t of the protective film is carried out on the assumption that the protective film covers the entire surface of the wafer W (the coverage factor of 100%). FIG. 7 is a flowchart of the sequence of a protective film applying method according to the modification. The sequence is controlled by the controller 90.

First, the liquid resin is supplied to the surface of an unprocessed wafer W held on the spinner table 51 to form a protective film on the surface of the wafer W (step S11). Specifically, the resin liquid supply nozzle 55 is positioned above the wafer W, and supplies a water-soluble liquid resin, e.g., PVA (polyvinyl alcohol), to the wafer W while the spinner table 51 is rotating at a predetermined rotational speed of 100 rpm, for example. The supplied liquid resin spreads radially outwardly from the center of the wafer W under centrifugal forces produced by the rotation of the spinner table 51, so that the liquid resin on the wafer W can be adjusted to a uniform thickness in the range from 0.5 to 2 μm, for example. The liquid resin thus distributed over the wafer W is dried into a protective film on the surface of the wafer W.

Then, the film thickness of the protective film formed on the surface of the wafer W is measured (step S12). Specifically, the frame 71 of the coverage state detector 70 is placed in the measurement position above the wafer W. The controller 90 energizes the light emitter 73 and the light detector 74, and measures the film thickness t of the protective film on the basis of the information of the light (detected signal) detected by the light detector 74 (t=H/2sinα). The controller 90 measures film thicknesses t at a plurality of measurement positions on the protective film on the wafer W, and stores these measurement positions and the film thicknesses t at the respective measurement positions in association with each other. The controller 90 may measure film thicknesses t using fluorescent light emitted from the protective film in response to absorption thereby of the stimulating light, or the reflection intensity of the reflected beam from the protective film.

Then, the controller 90 determines whether or not the measured film thickness t of the protective film falls in a predetermined range (step S13). In case the controller 90 measures film thicknesses t at a plurality of measurement positions, then the controller 90 determines whether or not all of the measured film thicknesses t at all of the measurement positions fall in the predetermined range. According to the modification, in order for the protective film to function as a protective film in the laser processing process, the controller 90 determines whether or not the film thickness t is equal to or larger than a lower-limit threshold value S1 of the predetermined range, but equal to or smaller than an upper-limit threshold value S2 thereof.

If the film thickness t of the protective film falls in the predetermined range (step S13: Yes) then the controller 90 decides that the protective film has properly been formed, and the sequence comes to an end. On the other hand, if the film thickness t of the protective film does not fall in the predetermined range (step S13: No), then the controller 90 cleans the protective film away (step S14). Specifically, the controller 90 positions the cleaning water nozzle 57 above the wafer W and causes the cleaning water nozzle 57 to supply cleaning water to the wafer W. Since the protective film is formed of the dried water-soluble liquid resin, the cleaning water supplied to the protective film dissolves the protective film and removes it from the surface of the wafer W.

Then, the controller 90 dries the wafer W (step S15). Specifically, the controller 90 rotates the spinner table 51 at a rotational speed of 3000 rpm, for example, for approximately 15 seconds. At this time, it is preferable to apply dry air to the rotating wafer W.

Then, the controller 90 corrects film forming conditions for forming protective films depending on the film thickness t measured in step S12 (step S16). In this modification, the controller 90 changes the rotational speed of the spinner table 51 depending on the film thickness t as a film forming condition. Specifically, if the film thickness t is smaller (thinner) than the lower-limit threshold value S1 of the predetermined range, then the controller 90 reduces the rotational speed of the spinner table 51, and if the film thickness t is larger (thicker) than the upper-limit threshold value S2 of the predetermined range, then the controller 90 increases the rotational speed of the spinner table 51, thereby adjusting the film thickness t to an appropriate value in the predetermined range. The thickness of the protective film (liquid resin) supplied to the wafer W can effectively be adjusted by increasing or reducing the rotational speed of the spinner table 51 stepwise, for example. For example, immediately after the liquid resin has been supplied to the wafer W, the controller 90 rotates the spinner table 51 at a high speed to spread the liquid resin over the wafer W, and then lowers the rotational speed of the spinner table 51 to make the liquid resin stable. The controller 90 rotates the spinner table 51 again at a high speed to adjust the protective film (liquid resin) to a desired uniform thickness.

Then, the controller 90 supplies the surface of the wafer W with the liquid resin again to form a protective film thereon (step S17). Inasmuch as the film forming condition for the protective film has been corrected depending on the film thickness t in step S16, the film thickness t of the protective film is adjusted to a value in the predetermined range, compared with step S11. Thereafter, the controller 90 measures the film thickness t of the protective film formed again on the surface of the wafer W (step S18). The film thickness t is measured in the same manner as with step S12 described above.

Then, the controller 90 determines whether or not the measured film thickness t of the protective film falls in the predetermined range (step S19). In step S19, the controller 90 determines in the same manner with step S13. If the film thickness t of the protective film falls in the predetermined range (step S19: Yes), then the controller 90 decides that the protective film has properly been formed on the wafer W because of the film forming condition corrected in step S16, and brings the sequence to an end. From now on, the controller 90 will form protective films on subsequent wafers W under the film forming condition corrected in step S16.

If the film thickness t of the protective film does not fall in the predetermined range (step S19: No), then the controller 90 decides that the film thickness t of the protective film is not appropriate despite the protective film being formed under the film forming condition corrected in step S16, and issues a warning (step S20). Based on the warning, the operator may change film forming conditions for forming protective films. The film thickness t of the protective film may be adjusted by, other than the rotational speed of the spinner table 51, either one of or a combination of the amount of the liquid resin supplied to the wafer W, the temperature (viscosity) of the liquid resin supplied to the wafer W, the period of time during which the spinner table 51 rotates, and the method by which the liquid resin is dried into the protective film. Therefore, the film thickness t can be adjusted to an appropriate value by changing or adjusting film forming conditions, e.g., changing the period of time during which the spinner table 51 rotates, adjusting the amount and temperature of the liquid resin supplied to the wafer W, or adjusting the method by which the liquid resin is dried into the protective film or the period of time during which the liquid resin is dried into the protective film.

The wafer W with the protective film formed thereon is delivered onto the chuck table 10, and processed by a laser beam that is applied from the beam condenser 22 of the laser beam irradiator 20 through the protective film on the wafer w to a given street L on the wafer W. When the wafer W is thus laser-processed, the given street L may be irradiated in a half cutting mode with a single laser beam to form a processed groove in the wafer W which does not reach the reverse side of the wafer W or in a full cutting mode with a plurality of laser beams to form a processed groove in the wafer W which substantially reaches the reverse side of the wafer W. Alternatively, after two film peel prevention grooves have been formed in the wafer W, a dividing groove may be formed to a predetermined depth in the film layer and the substrate centrally between the two film peel prevention grooves (see Japanese Patent Laid-Open No. 2006-196641).

According to the present modification, as described above, the protective film applying method has the step of holding the reverse side of the wafer W while exposing the surface of the wafer W, the step of forming a protective film on the exposed surface of the wafer W, and the step of determining whether or not the protective film covers the surface of the wafer W in a predetermined range. If it is determined that the film thickness t of the formed protective film does not fall in the predetermined range, the formed protective film is cleaned away, and then a protective film is formed again on the surface of the wafer W under a film forming condition corrected depending on the film thickness t. Therefore, the film thickness t of the protective film can be adjusted to an appropriate value, so that a protective film can appropriately be formed depending on the state of the wafer W. In particular, since a particular area of the protective film formed on the surface of the wafer W can partly be detected by measuring the film thickness t, the modification is effective in detecting the coverage state of the protective film on a wafer W where bumps are formed on devices.

Figure 8:
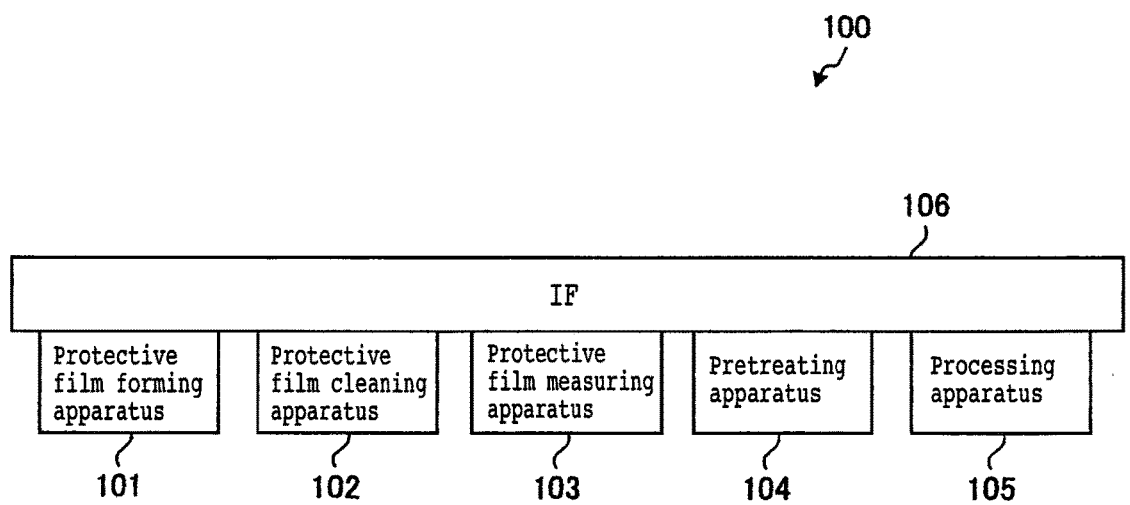
FIG. 8 is a functional block diagram of a processing system according to another embodiment of the present invention.

A processing system according to another embodiment of the present invention will be described below. FIG. 8 depicts in functional block form the processing system according to the other embodiment of the present invention. The laser processing apparatus 1 described above includes, on the apparatus body 2, the laser beam irradiator 20, the protective film forming and cleaning unit 50, the ultraviolet irradiator 60, the coverage state detector 70, and the controller 90. As depicted in FIG. 8, a processing system (protective film applying apparatus), denoted by 100, includes a protective film forming apparatus 101, a protective film cleaning apparatus 102, a protective film measuring apparatus 103, a pretreating apparatus 104, a processing apparatus 105, and an interface 106. The protective film forming apparatus 101, the protective film cleaning apparatus 102, the protective film measuring apparatus 103, the pretreating apparatus 104, and the processing apparatus 105, which are independent of each other, are interconnected by the interface 106.

The protective film forming apparatus (protective film applying means) 101 forms a protected film on the surface (processed surface) of the wafer W, and is arranged to form, the protective film forming and cleaning unit 50 described above. The protective film cleaning apparatus (cleaning means) 120 cleans away and removes the protective film formed on the surface of the wafer W, and is arranged to clean away the protective film forming and cleaning unit 50 described above. The protective film forming apparatus 101 and the protective film cleaning apparatus 102 may not be independent of each other, but may be integrally combined with each other.

The protective film measuring apparatus (detecting means) 103 detects the coverage state of the protective film formed on the surface of the wafer W, and is arranged to detect at least one of the film thickness of the protective film and the coverage factor of the protective film, as a value representing coverage state of the protective film. The pretreating apparatus (pretreating means) 104 performs a predetermined pretreating process on the wafer W depending on the film thickness of the protective film and/or the coverage factor of the protective film that is detected by the protective film measuring apparatus 103. The pretreating means 104 has structural details identical to those of the ultraviolet irradiator 60 and also structural details for supplying pure water to the processed surface of the wafer W. The structural details for supplying pure water to the surface of the wafer W may be dispensed with insofar as the pretreating apparatus 104 shares them with the protective film cleaning apparatus 102. The processing apparatus 105 irradiates the surface of the wafer W with a laser beam to form a laser-processed groove in the wafer W. The processing apparatus 105 has structural details identical to those of the laser beam irradiator 20 described above. In addition to or instead of the structural details for irradiating the surface of the wafer W with a laser beam to form a laser-processed groove in the wafer W, the processing system 100 may have a dicing apparatus including a rotatable cutting blade for cutting the surface of the wafer W.

The interface 106 has a function to feed wafers W between the each apparatus, and functions as a controller for coordinating the operation of the each apparatus. A wafer W is fed by the interface 106 to one of the apparatus, processed thereby, and then fed by the interface 106 to another of the apparatus.

Figure 9:
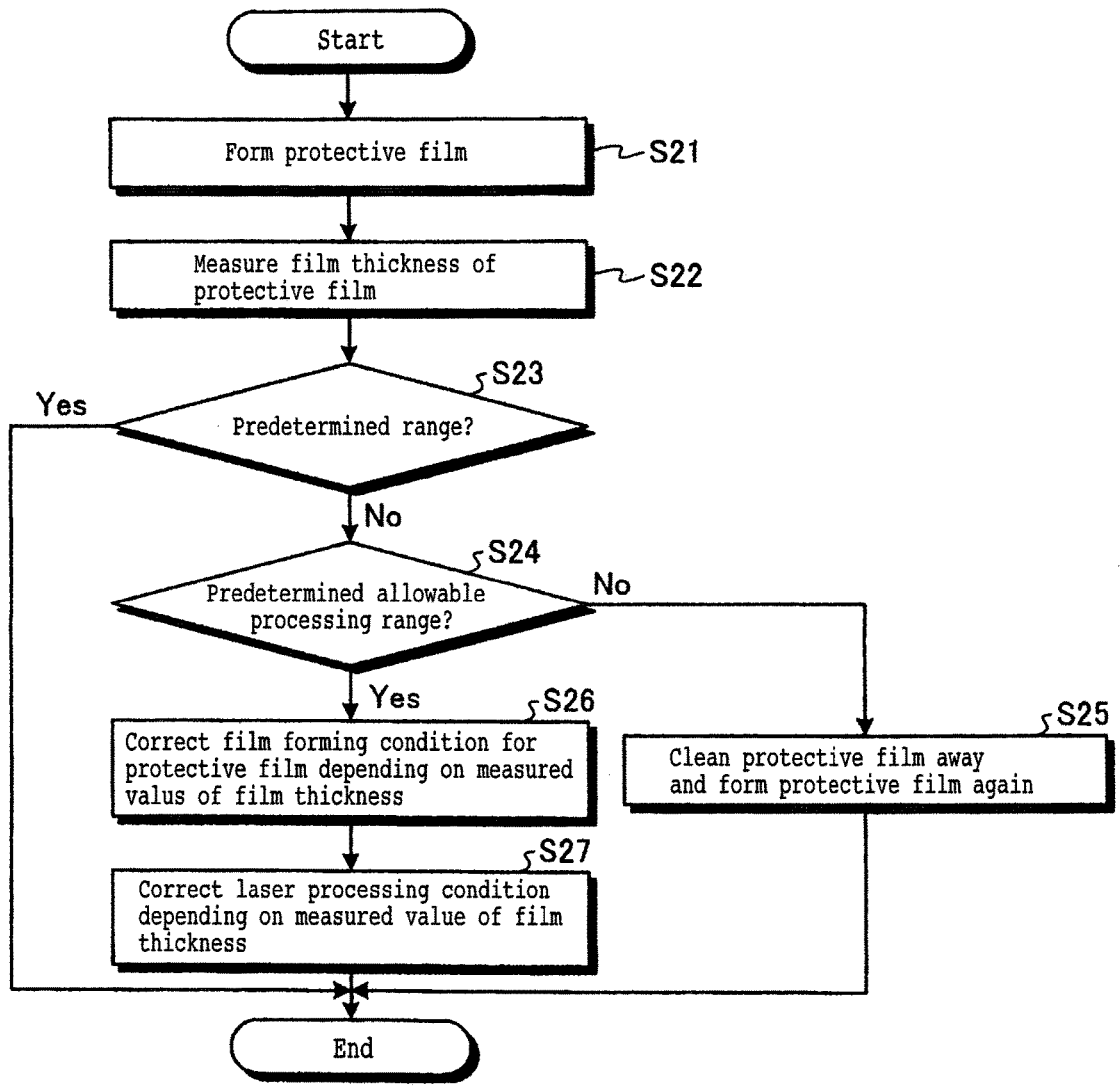
FIG. 9 is a flowchart of the sequence of a protective film applying method according to still another embodiment of the present invention.

A protective film applying method according to still another embodiment of the present invention will be described below. According to the embodiment described above, the coverage factor R or the film thickness t of the protective film is determined as a value representing the coverage state of the protective film formed on the surface of the wafer W. Then, a pretreating process selected depending on the value representing the coverage state of the protective film is performed on subsequent wafers W on which protective films are to be formed. According to the present embodiment, however, a processing condition for the laser processing process to be performed on the wafer W is corrected depending on the coverage state of the protective film. FIG. 9 is a flowchart of the sequence of the protective film applying method according to the still other embodiment. In the protective film applying method depicted in FIG. 9, the film thickness t of the protective film is used as a value representing the coverage state of the protective film. It is assumed in the protective film applying method that the film thickness t does not fall in a predetermined range, but in a predetermined allowable processing range wider than the predetermined range.

First, the liquid resin is supplied to the surface of an unprocessed wafer W held on the spinner table 51 to form a protective film on the surface of the wafer W (step S21). Specifically, the resin liquid supply nozzle 55 is positioned above the wafer W, and supplies a water-soluble liquid resin, e.g., PVA (polyvinyl alcohol), to the wafer W while the spinner table 51 is rotating at a predetermined rotational speed of 100 rpm, for example. The supplied liquid resin spreads radially outwardly from the center of the wafer W under centrifugal forces produced by the rotation of the spinner table 51, so that the liquid resin on the wafer W can be adjusted to a uniform thickness in the range from 0.5 to 2 μm, for example. The liquid resin thus distributed over the wafer W is dried into a protective film on the surface of the wafer W. The film thickness of the protective film can be adjusted by the supplied amount of liquid resin, the rotational speed of the spinner table 51, the period of time during which the spinner table 51 rotates, or the method by which the liquid resin is dried into the protective film. The liquid resin may be dried into the protective film by rotating the wafer W with the spinner table 51 or applying light from a xenon flash lamp or the like to the liquid resin on the wafer W.

Then, the film thickness of the protective film formed on the surface of the wafer W is measured (step S22). Specifically, the frame 71 of the coverage state detector 70 is placed in the measurement position above the wafer W. The controller 90 energizes the light emitter 73 and the light detector 74, and calculates the film thickness t of the protective film on the basis of the information of the light (detected signal) detected by the light detector 74 (t=H/2sinα). The controller 90 measures film thicknesses t at a plurality of measurement positions on the protective film on the wafer W, and stores these measurement positions and the film thicknesses t at the respective measurement positions in association with each other. The controller 90 may measure film thicknesses t using fluorescent light emitted from the protective film in response to absorption thereby of the stimulating light, or the reflection intensity of the reflected beam from the protective film.

Then, the controller 90 determines whether or not the measured film thickness t of the protective film falls in a predetermined range (step 23). In case the controller 90 measures film thicknesses t at a plurality of measurement positions, then the controller 90 determines whether or not all of the measured film thicknesses t at all of the measurement positions fall in the predetermined range. The predetermined range is a range for a film thickness t optimum for laser-processing the wafer W through the protective film. If the film thickness t of the protective film falls in the predetermined range (step S23: Yes) then the controller 90 decides that the protective film has properly been formed, and the sequence comes to an end. On the other hand, if the film thickness t of the protective film does not fall in the predetermined range (step S23: No), then the controller 90 determines whether or not the measured film thickness t falls in the predetermined allowable processing range (step S24). As described above, the predetermined allowable processing range is wider than the predetermined range referred to above. For example, the predetermined allowable processing range may be a range whose upper-limit value and lower-limit value are larger than the upper-limit value and lower-limit value, respectively of the predetermined range by small values of 10%, for example.

If the measured film thickness t does not fall in the predetermined allowable processing range (step S24: No), the controller 90 cleans the protective film away from the wafer W, and forms a protective film again on the surface of the wafer W (step S25). The controller 90 cleans the protective film away and forms a protective film again in the same manner as with step S4 and step S7 described above with respect to the flowchart depicted in FIG. 6, thus description is omitted herein.

If the measured film thickness t falls in the predetermined allowable processing range (step S24: Yes), then the controller 90 corrects a film forming condition for forming protective films on subsequent wafers W depending on the measured film thickness t (step S26), and corrects a laser processing condition for the wafer W depending on the measured film thickness t (step S27). The controller 90 may correct a film forming condition and a laser processing condition in reverse order or concurrently.

The controller 90 corrects a film forming condition for forming protective films by changing the rotational speed of the spinner table 51 or the period of time during which the spinner table 51 rotates, adjusting the amount and temperature of the liquid resin supplied to the wafer W, or adjusting the method by which the liquid resin is dried into the protective film or the period of time during which the liquid resin is dried into the protective film in order that the film thickness t will approach a predetermined value. The controller 90 may form a protective film by changing the timing sequence of the rotation of the spinner table 51 and the supply of the liquid resin, or applying a plurality of coats of the liquid resin to the surface of the wafer W.

The controller 90 may correct laser processing conditions as follows:

(1) If the film thickness t is larger than the upper-limit value of the predetermined range, then the controller 90 increases the number of times that the laser processing process is carried out on a street L to be processed, i.e., the number of passes of the laser beam on a street L to be processed, thereby forming a laser-processed groove having a predetermined depth. In addition to or instead of increasing the number of passes, the controller 90 may increase the output power of the laser beam. The controller 90 may lower the speed at which the chuck table 10 is delivered.

(2) If the film thickness t is smaller than the lower-limit value of the predetermined range, then the controller 90 reduces the number of times that the laser processing process is carried out on a street L to be processed, i.e., the number of passes of the laser beam on a street L to be processed, thereby forming a laser-processed groove having a predetermined depth. In addition to or instead of reducing the number of passes, the controller 90 may lower the output power of the laser beam. The controller 90 may increase the speed at which the chuck table 10 is delivered. If the film thickness t is small, then after two film peel prevention grooves have been formed in the wafer W along the street L, the controller 90 may form a dividing groove to a predetermined depth in the protective film and the wafer W centrally between the two film peel prevention grooves.

On a wafer where electrodes called bumps are provided on the surfaces of devices, the film thickness t tends to be reduced at the vertexes of the bumps by as much as the height of the bumps. Therefore, after a wafer W with bumps has been laser-processed, it may be processed by plasma etching to remove residues of $SiO_2$, for example, deposited when the wafer W was laser-processed.

The preferred embodiments of the present invention have been described above. However, the embodiments are illustrated by way of example only and should not be interpreted as restricting the scope of the present invention. For example, in the above embodiments, the ultraviolet irradiator 60 is disposed in facing relation to the spinner table 51 of the protective film forming and cleaning unit 50. However, an ultraviolet irradiator may be provided in the cassette elevator for placing thereon the cassette 30 that stores wafers W therein. In the above embodiments, if the coverage factor R or the film thickness t of the protective film does not fall in the predetermined range, then the protective film is cleaned away, and a protective film is formed again on the surface of the wafer W. However, if the fault of the protective film is insignificantly minor, a protective film may be additionally applied to a local protective film-free region on the basis of the relationship between the measurement positions and the film thicknesses t.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of applying a protective film including a resin to a surface of a workpiece, the method comprising the steps of:

holding a reverse side of the workpiece while exposing the surface of the workpiece;

forming a protective film on the exposed surface of the workpiece; and determining whether or not said protective film covers said surface in a predetermined range, wherein if it is decided that a film thickness of the protective film formed on the surface of the workpiece does not fall in the predetermined range, then the formed protective film is cleaned away, a pretreating process selected depending on a magnitude of the film thickness with respect to the predetermined range is performed on the surface of the workpiece, and a protective film is formed again on the surface.

* * * * *